US 6,586,169 B2

(12) United States Patent
Brauch et al.

(10) Patent No.: US 6,586,169 B2
(45) Date of Patent: Jul. 1, 2003

(54) LITHOGRAPHY EXPOSURE DEVICE AND LITHOGRAPHY PROCESS

(75) Inventors: Uwe Brauch, Stuttgart (DE); Hans Opower, Krailling (DE)

(73) Assignee: Deutsches Zentrum fuer Luft- und Raumfahrt e.V., Bonn (DE)

(*) Notice: Subject to any disclaimer, the term of this patent is extended or adjusted under 35 U.S.C. 154(b) by 197 days.

(21) Appl. No.: 09/768,383

(22) Filed: Jan. 19, 2001

(65) Prior Publication Data

US 2001/0021484 A1 Sep. 13, 2001

Related U.S. Application Data

(63) Continuation of application No. PCT/EP99/03432, filed on May 19, 1999.

(51) Int. Cl.[7] .................................................. G03F 7/20
(52) U.S. Cl. ....................... 430/394; 430/311; 430/312; 430/313; 430/322; 430/396
(58) Field of Search ................................. 430/311, 312, 430/313, 322, 394, 396

(56) References Cited

U.S. PATENT DOCUMENTS

| 4,402,571 A | * | 9/1983 | Cowan et al. | ......... 350/162.17 |
| 4,869,999 A | * | 9/1989 | Fukuda et al. | ............... 430/311 |
| 6,002,466 A | | 12/1999 | Brauch et al. | ................. 355/53 |
| 6,324,250 B1 | * | 11/2001 | Amemiya et al. | ............. 378/34 |
| 2001/0021484 A1 | * | 9/2001 | Brauch et al. | ............... 430/312 |

FOREIGN PATENT DOCUMENTS

| DE | 31 18 802 | 2/1982 |
| DE | 195 22 936 | 1/1997 |
| WO | WO 98/00760 | 1/1998 |

* cited by examiner

Primary Examiner—Mark F. Huff
Assistant Examiner—Nicole Barreca
(74) Attorney, Agent, or Firm—Barry R. Lipsitz; Douglas M. McAllister

(57) ABSTRACT

In order to create a lithography exposure device for producing structures extending in a surface area in a light-sensitive layer, with which a radiation field can be generated in the light-sensitive layer and with a control for controlling the intensity and position of the radiation field in such a manner that by means of a large number of successive exposure steps a plurality of conversion areas can be generated, in which the material of the light-sensitive layer is converted from an initial state into an end state and which together result in the structures, with which it is possible to produce, without masks, structures which have in at least one direction an extension which is smaller than that of one of the radiation fields used, it is suggested that with at least some of the exposure steps the control generate radiation fields with a distribution of energy which makes the action of at least two radiation fields on the same conversion area necessary in order to transfer the material of the light-sensitive layer in this area into the converted end state.

9 Claims, 12 Drawing Sheets

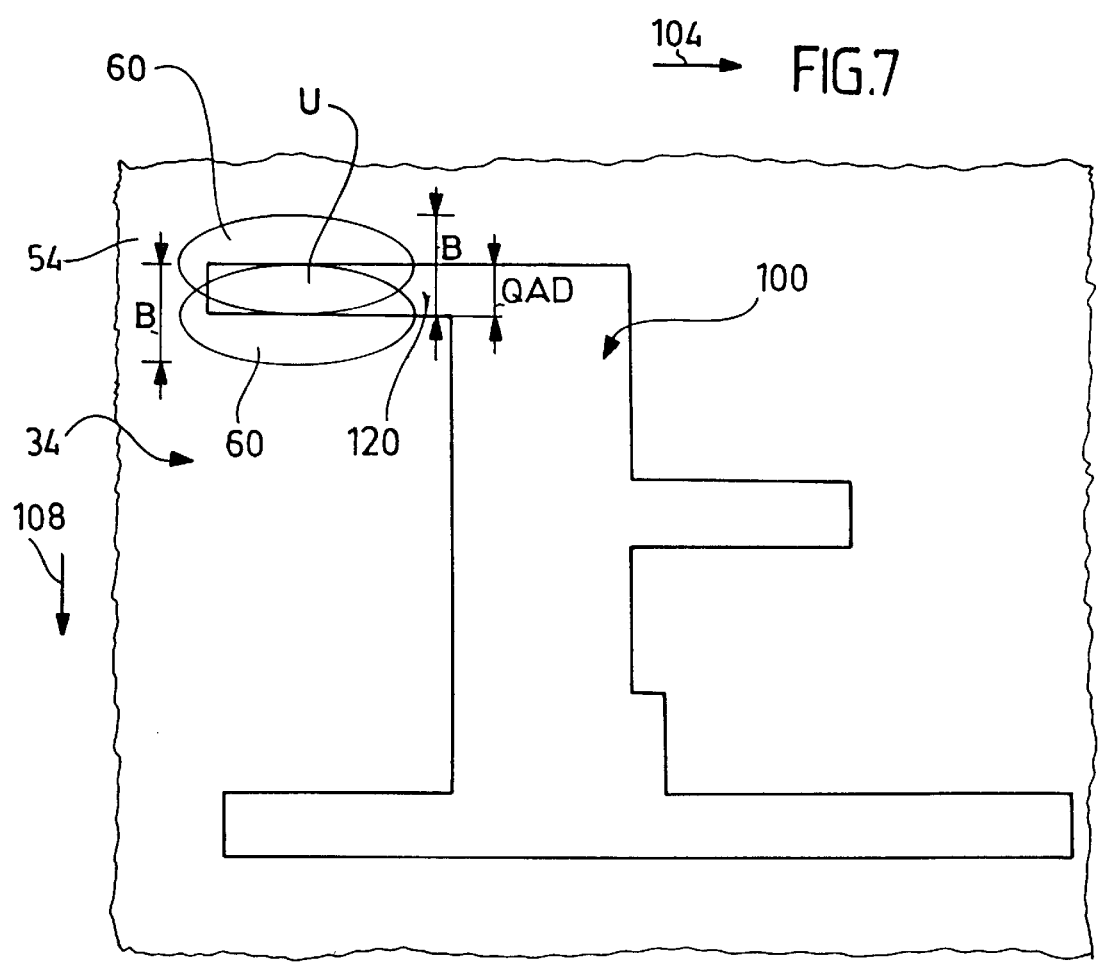

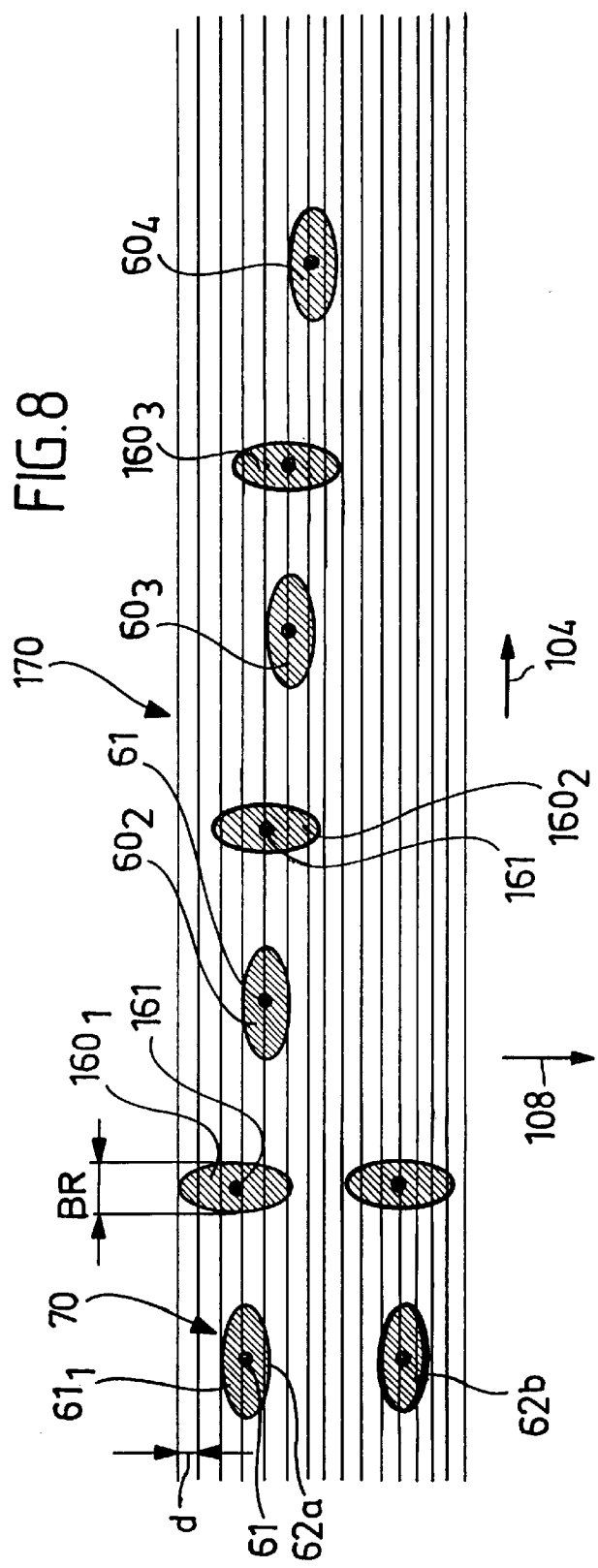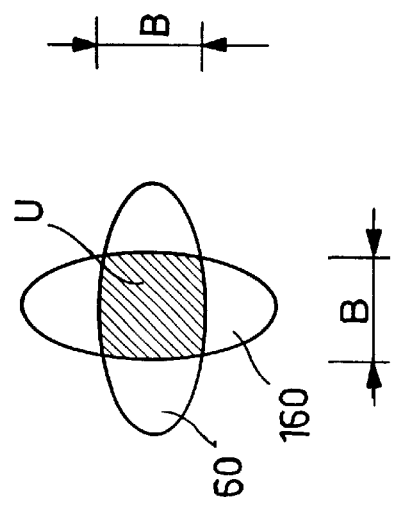

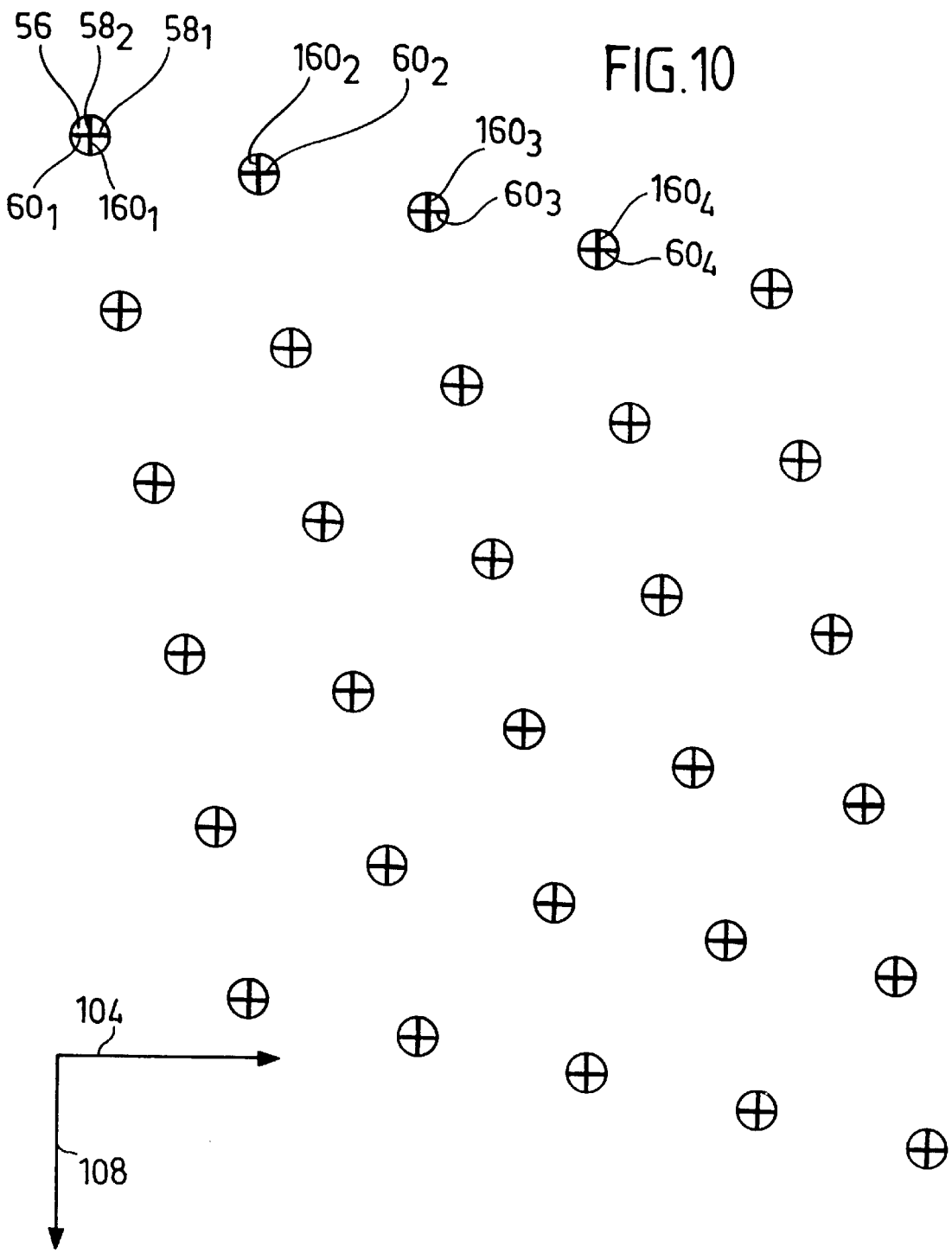

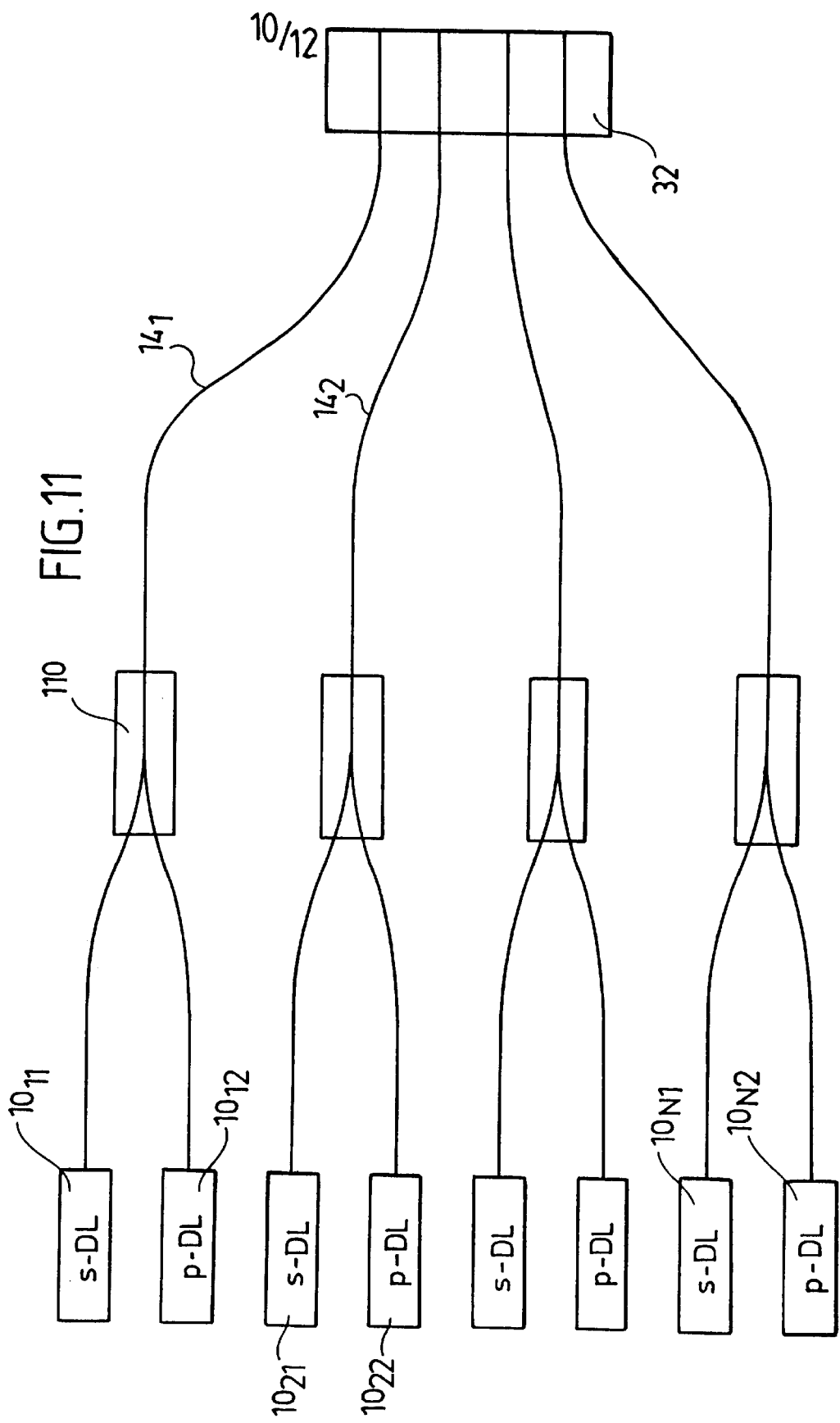

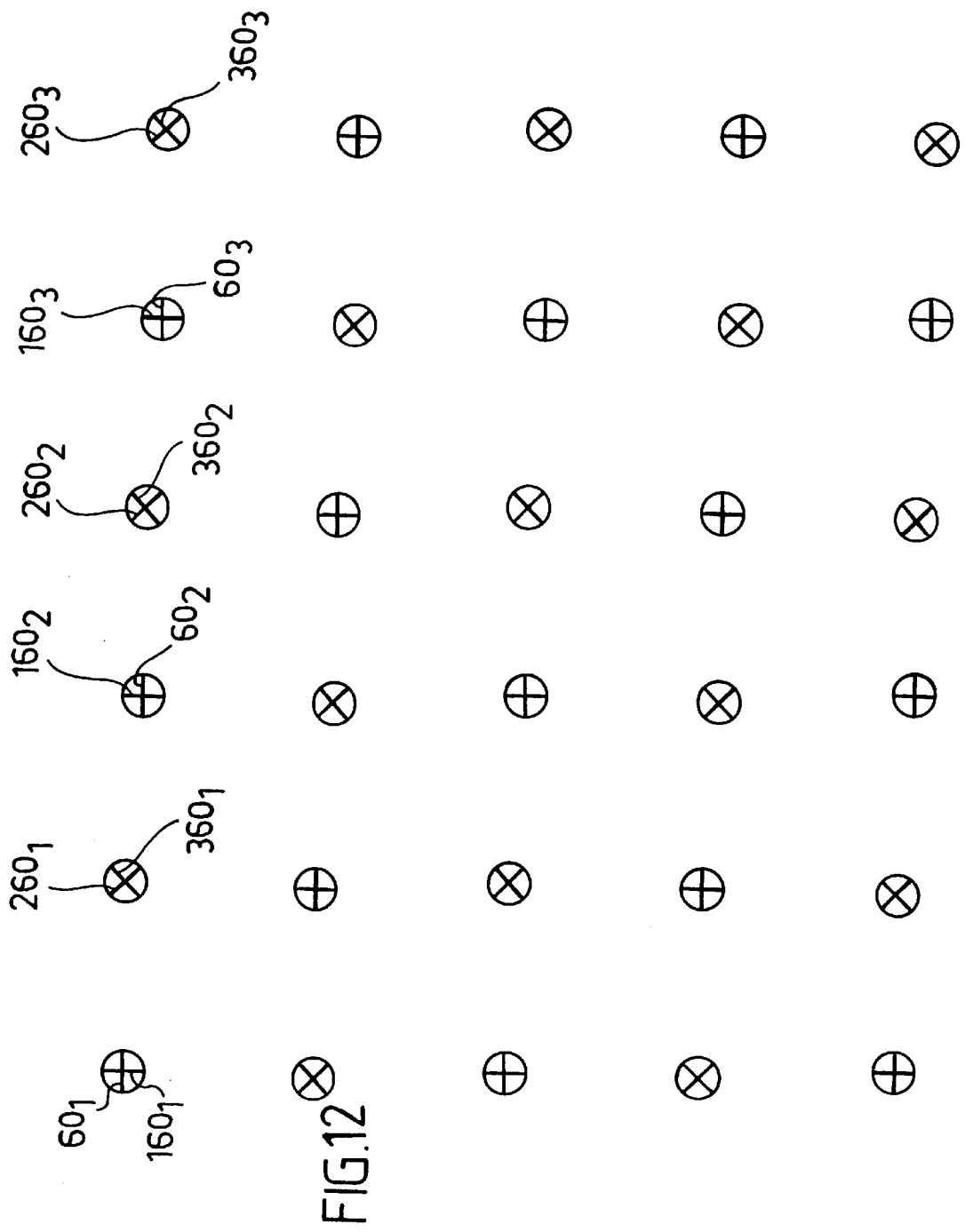

LITHOGRAPHY EXPOSURE DEVICE AND LITHOGRAPHY PROCESS

This application is a continuation of international application number PCT/EP99/03432 filed on May 19, 1999.

The present disclosure relates to the subject matter disclosed in International Application No. PCT/EP99/03432 of May 19, 1999, the entire specification of which is incorporated herein by reference. The invention relates to a lithography exposure device for producing structures extending in a surface area in a light-sensitive layer with a mounting device for the light-sensitive layer, with an exposure unit comprising at least one laser radiation source, an optical focusing means for the laser radiation associated with the laser radiation source and a screen associated with the optical focusing means and comprising a screen aperture which is elongated in a longitudinal direction and with which a radiation field can be generated in the light-sensitive layer which has in a lateral direction extending transversely to the longitudinal direction of the screen aperture an effective lateral extension which is in the order of magnitude of the wavelength of the laser radiation or smaller, with a movement unit for generating a relative movement between the optical focusing means and the mounting device and with a control for controlling the intensity and position of the radiation field relative to the light-sensitive layer in such a manner that a plurality of conversion areas can be generated in the light-sensitive layer by means of a large number of successive exposure steps and in these conversion areas the material of the light-sensitive layer is converted from an initial state into a converted end state and they together result in the structures.

A lithography exposure device of this type is known from WO 98/00760. This lithography exposure device is, however, provided only for representing structures, the extension of which is greater than that of the radiation field.

The object underlying the invention is to create a lithography exposure device, with which it is possible to produce, without masks, structures which have in at least one direction an extension which is smaller than that of one of the radiation fields used.

The object of the present invention is, in particular, to create a lithography exposure device, with which structures can be produced in the range of less than 200 nanometers extension.

This object is accomplished in accordance with the invention, by a lithography exposure device of the type described at the outset, in that with at least some of the exposure steps the control generates radiation fields with a distribution of energy which makes the action of at least two radiation fields on the same conversion area necessary in order to transfer the material of the light-sensitive layer in this area into the converted end state.

The core of the inventive solution is thus to be seen in the fact that the intensity and the distribution of the intensity of the radiation fields used is adjusted such that the effect of one radiation field in the area of action of the light-sensitive layer does not lead to a transfer of the material from the initial state into the converted end state but rather merely to a partial conversion which does not yet have the desired state. Only the action of at least a second radiation field on the same conversion area creates the possibility that in the area, in which the two radiation fields overlap, the possibility exits of a complete conversion of the material of the light-sensitive layer into the converted state insofar as the distributions of the intensity are such that the sum of the intensities in the conversion area is sufficiently large to exceed the threshold intensity for the conversion of the light-sensitive material from the initial state into the converted state.

It is thus possible, due to the use and the action of two radiation fields and the fact that the effects of the intensities have to be added together in order to exceed the threshold for the conversion of the material of the light-sensitive layer, to produce at least sections of structures, in which the extension of the sections in one direction is at the most of the same size if not smaller than the extension of one of the radiation fields in the respective direction.

In principle, it is possible to give each radiation field such a distribution of intensity that even with congruent superposition of at least two radiation fields the threshold for the conversion of the material of the light-sensitive layer from the initial state into the converted state is exceeded only in one section of the radiation fields and so the congruent superposition of two radiation fields already leads, in the long run, to a conversion area which has in at least one direction an extension which is smaller than that of the two utilized radiation fields themselves.

One particularly favorable solution does, however, provide for the two radiation fields acting on the same conversion area to be arranged so as not to be congruent but rather only partially overlapping so that a conversion area corresponding at the most to the overlapping area can already be generated due to the partial overlapping of the radiation fields and this conversion area has in the direction of the partial overlapping an extension which is smaller than that of one of the radiation fields themselves.

With the overlapping arrangement of two radiation fields it is possible to arrange the radiation fields in a parallel alignment in relation to one another, i.e. with longitudinal directions extending parallel to one another, namely such that these partially overlap.

One particularly advantageous solution provides for a first radiation field aligned in a first direction to be arranged so as to overlap with a second radiation field extending in a second direction at an angle or transversely to the first for generating a conversion area so that a complete overlapping is already excluded from the outset due to the radiation fields extending at an angle or transversely to one another and only a partial overlapping is possible, and thus the conversion area can have at the most an extension which corresponds to the overlapping area of the two radiation fields.

In this respect, it is particularly advantageous when the second radiation field extends essentially at right angles relative to the first radiation field.

A further, advantageous embodiment provides for more than two radiation fields partially overlapping with one another to be used in order to obtain a conversion area in the light-sensitive layer.

In such a case, it is preferably provided for the radiation fields contributing to a single conversion area to be arranged so as to follow one another approximately at the same angular distance.

With respect to the partial superposition of radiation fields aligned at an angle or transversely to one another it is possible to superimpose the elongated radiation fields with one another with respective end areas located in the longitudinal direction.

It is, however, particularly advantageous when the elongated radiation fields are arranged such that at least one of the radiation fields is arranged so as to overlap with the other radiation field in a central area in order to generate a single conversion area.

It is even more advantageous when the radiation fields are arranged such that their central areas partially overlap one another.

Such an arrangement of the radiation fields has the advantage that with it the positioning accuracy of the two radiation fields relative to one another can be less and that, in addition, the most intensity is customarily available in the central areas of the radiation fields and so the superposition with central areas of the radiation fields also leads summarily to the highest obtainable intensity values and thus the intensity of the laser radiation can also, for example, be utilized in an optimum manner.

With respect to the time sequence, with which the at least two radiation fields are superimposed with one another, the most varied of solutions are conceivable.

One possibility, for example, provides for the control to control the laser radiation sources such that the radiation fields acting on a conversion area act on it one after the other with respect to time.

In such a case, the material of the light-sensitive layer has to be designed such that the first radiation field leads to a partial conversion of the material proceeding from the initial state and this partial conversion is maintained for such a time until the second radiation field acts and leads to the complete conversion into the converted state.

Another advantageous solution provides for the radiation fields to act on the conversion area in a manner overlapping at least with respect to time. In this case, it is sufficient for the material of the light-sensitive layer to keep the state reached due to the action of the first radiation field stored for such a time until the second radiation field acts on the material.

In a further advantageous case of the inventive solution it is provided for the control to control the laser radiation sources such that the radiation fields acting on a conversion area act on this simultaneously, wherein, in this case, the material of the light-sensitive layer experiences with respect to the intensity the effect of the sum of the two intensities and so the material need not be designed such that it stores a partial conversion with respect to time.

With respect to the design of the screen, it has been assumed thus far that this merely has an elongated screen aperture. This means that a laser radiation source controllable with respect to the intensity is to be associated with each screen aperture, wherein, in this case, a unit which is suitable for the control of the intensity and is supplied with a laser radiation of constant power also falls under the term laser radiation source, wherein the laser radiation of constant power can be made available to several such intensity-controlling units.

Therefore, at least one separate intensity control must be associated with each screen aperture in order to carry out the exposure when the screen aperture is located above the desired conversion area in the desired positioning.

It is, however, particularly advantageous when the screen has two screen apertures arranged so as to overlap and extending at an angle or transversely to one another and laser radiation is supplied to the screen in two directions of polarization, namely one direction of polarization, with which the first radiation field results, and one direction of polarization, with which a second radiation field extending at an angle or transversely to the first radiation field results.

The directions of polarization and the screen apertures preferably extend transversely, preferably approximately at right angles to one another in order to avoid any interaction of the polarized laser radiations.

In this case, only a single intensity control for both radiation fields is required since the overlapping area is already determined by the arrangement of the screen apertures in the same screen and thus an overlapping area of the radiation fields results which is already defined by the geometry of the screen apertures and so any positioning resources whatsoever for the arrangement of the second radiation field relative to the first radiation field and thus the positioning resources for an adequately precise overlapping can be dropped.

Even when an overlapping of more than two radiation fields is brought about for generating a conversion area, it is preferably provided for these to be generated by two screens each with two screen apertures crossing over one another in an overlapping manner.

In conjunction with the embodiment of an inventive lithography exposure device described thus far it has merely been assumed that the at least two radiation fields overlapping with one another for generating a conversion area can be generated with it.

However, in order to be able to produce sufficiently complex structures in a justifiably short time, it is preferably provided for the lithography exposure device to have a plurality of laser radiation sources for generating a plurality of laser radiations, with which a plurality of radiation fields can be generated which can be activated and deactivated by the control in accordance with the shape of the structure. As a result, several sections of the structure can preferably be produced in the same period of time within the scope of a single exposure movement, preferably even in a single exposure movement direction.

In this respect, it is preferably provided for the plurality of generatable radiation fields to have a first radiation field pattern consisting of first generatable radiation fields which are arranged in a defined manner relative to one another and the lateral extensions of which extend parallel to a first direction.

In this respect, the first direction can be aligned either parallel to the exposure movement direction or transversely to the exposure movement direction.

The first direction is preferably aligned transversely to the exposure movement direction.

An advantageous development of this embodiment provides for the first radiation field pattern, proceeding from a first radiation field serving as reference, to have first radiation fields arranged at different distances in a transverse direction extending at right angles to the exposure movement direction, for each first radiation field of the first radiation field pattern to have in the transverse direction a different distance from the first radiation field serving as reference than the remaining first radiation fields, for the distances of all the first radiation fields of the first radiation field pattern to form a series of distances, with which each distance is greater by one increment than another one of the distances and for the increment to be smaller than an extension of the first radiation fields in the transverse direction.

This solution has the advantage that only one movement of the optical focusing means relative to the light-sensitive layer in the direction of the exposure movement direction is controllable by the control for the production of at least one part of the structure and all the positionings of the radiation fields relative to one another for generating the structure can be brought about by activating the laser units generating the individual radiation fields.

Within the scope of the inventive solution it would be sufficient to work with the first radiation fields of the first radiation field pattern in an inventive manner, wherein only a partial superposition of radiation fields aligned in the same direction is possible.

In order to be able to also superimpose radiation field patterns aligned at an angle, in particular, transversely to one another with high precision it is preferably provided for the plurality of generatable radiation fields to have a second radiation field pattern consisting of second generatable radiation fields which are arranged in a defined manner relative to one another and the lateral extensions of which extend parallel to a second direction.

This second direction preferably extends at the angle or, in particular, transversely to the first direction.

In order to obtain the same high precision as with the first radiation fields, it is preferably provided for the second radiation field pattern, proceeding from a second radiation field serving as reference, to have second radiation fields arranged at different distances in a transverse direction extending at right angles to the exposure movement direction, for each second radiation field of the radiation field pattern to have in the transverse direction a different distance from the second radiation field serving as reference than the remaining second radiation fields and for the distances of all the second radiation fields of the second radiation field pattern to form a series of distances, with which each distance is greater by one increment than another one of the distances and for the increment to be smaller than an extension of the second radiation fields in the transverse direction.

In this respect, it is particularly favorable when the increment is at the most half the extension of the radiation fields in the transverse direction.

It is particularly favorable when the radiation field pattern comprises at least one series of first radiation fields arranged in a row, the fields having a distance from one another at right angles to the exposure movement direction which is smaller than their extension at right angles to the exposure movement direction.

As a result, it is possible to create a lithography exposure device, with which it is possible to generate the radiation fields with high precision within an area located at right angles to the exposure movement direction due to the extension of the series.

In this respect, it is preferably provided for the distance between the radiation fields of the series to be constant at right angles to the exposure movement direction.

In the simplest case, the radiation fields are arranged in the series in a row extending along a straight line.

A solution is particularly favorable, with which the radiation fields in the respective row have in series direction a distance from one another which is greater than their extension in series direction so that as a result of this distance a degree of freedom exists with respect to the arrangement of the radiation fields in the series direction.

In order to make it possible for the radiation fields to have in the transverse direction extending at right angles to the exposure movement direction as small a distance from one another as possible which is, where possible, smaller than the extension of the light spots in the transverse direction, it is preferably provided for the series direction to form with the exposure movement direction an angle of not equal to 90°, for example, smaller than 90°. As a result, the projection of the light spots arranged in the series onto the transverse direction extending at right angles to the exposure movement direction causes a reduction in the distance to the degree specified above.

In principle, semiconductor lasers, which generate laser radiation in the blue spectral range or in the close ultraviolet, may be used with the inventive device. As long as semiconductor lasers of this type do not, so far, have the price-to-power ratio required for commercial usage, it is preferably provided for the exposure unit to comprise frequency doublers connected after the semiconductor lasers. In this case, it is possible to use conventional semiconductor lasers operating in the red or infrared spectral range and to double the frequency.

In conjunction with the preceding explanations concerning the individual embodiments, it has not been explained in detail how the laser radiation is intended to be guided from the semiconductor lasers to the optical beam guidance means since the optical beam guidance means and the mounting device have to be movable relative to one another. For example, it would be conceivable—as already mentioned above—to use the semiconductor laser arrangements or semiconductor laser arrays directly and, proceeding from this system, to image the individual laser beams onto the light-sensitive layer by means of the optical beam guidance means for generating the radiation field pattern so that the semiconductor lasers and the optical beam guidance means form a unit and this unit and the mounting device are movable relative to one another.

On account of the operating devices which entail considerable resources and are required for semiconductor laser units this is, however, in many cases possible only to a limited extent. For this reason, it is advantageously provided for the exposure unit to comprise light guides conducting the laser radiation to the optical beam guidance means. These light guides offer the possibility of bringing the laser radiation from semiconductor lasers arranged at a greater distance to the optical beam guidance means with as little loss as possible so that, in this case, the optical beam guidance means and the mounting device form the units movable relative to one another.

Monomode fibers are preferably used for light guides of this type and as semiconductor lasers those which operate in the single mode operation.

The light guides are preferably designed such that they have a first end, into which the laser radiation can be coupled, and a second end, from which the laser radiation exits, and that a collimating element is arranged to follow each second end, this element collimating the laser radiation exiting divergently from each individual second end of the light guides and forming a collimated radiation bundle therefrom.

Such a solution has the great advantage that it is possible to image the collimated radiation bundle onto the light-sensitive layer in an optimum manner and thus obtain as small a diameter of the resulting radiation field as possible, wherein, in this case, the second ends and the optical beam guidance means comprising the optical collimating means preferably form a unit and this unit and the mounting device are movable relative to one another.

With respect to the design of the optical beam guidance means, no further details have so far been given. One advantageous embodiment, for example, provides for the optical beam guidance means to comprise a telescopic device imaging on a reduced scale. With a telescopic device of this type it is possible to advantageously image the laser radiation, which is generated with the semiconductor lasers at great distances as a result of the technology and with respect to the size of the radiation fields to be generated, such that the distances between the radiation fields and the radiation spots themselves become smaller.

With such a telescopic device, reductions of more than a factor of 10 can be achieved in a simple manner.

In order, in particular, to be able to directly generate lithographic structures for the direct production of an integrated circuit, it is advantageously provided for the optical beam guidance means to comprise an optical microscope generating the radiation fields. Such an optical microscope offers a simple possibility of obtaining as great a reduction as possible in the distances between the individual radiation fields.

An optical microscope does, however, have the disadvantage that the extension of the radiation fields is severely dependent on the distance of the optical microscope from the layer to be exposed. For this reason, it is advantageously provided for the optical microscope to be arranged on a vertical positioning device and to be positionable by this during the exposure movement at a defined distance above the light-sensitive layer. Such a vertical positioning device thus creates the possibility of eliminating the disadvantages of such an optical microscope or keeping them as small as possible.

It is particularly expedient when a distance between an underside of the optical microscope facing the light-sensitive layer and the light-sensitive layer can be maintained by the vertical positioning device.

In this respect, it is preferably provided for the distance to be in the order of magnitude of a diameter of the individual radiation field on the light-sensitive layer.

With the optical microscope described thus far it is possible to obtain radiation fields which are limited in their diffraction and the extension of which is in the order of magnitude of the wavelength of the laser radiation.

However, in order to obtain as defined a size as possible of the individual light spots, in particular, in the range of the wavelength of the laser light used or smaller, it is preferably provided for the optical microscope to be provided with a near-field optical means defining the size of the radiation fields on the light-sensitive layer.

Such a near-field optical means has the great advantage that it opens up the possibility, on account of its closeness to the radiation fields generated on the light-sensitive layer, of determining the final size of the radiation fields on the light-sensitive layer to a great extent independent of the preceding beam guidance.

In this respect, the near-field optical means is preferably arranged directly on an underside of the microscope objective facing the light-sensitive layer so that the distance between the near-field optical means and the light-sensitive layer can be kept very small.

The near-field optical means may be designed in the most varied of ways.

One embodiment, for example, provides for the near-field optical means to define the radiation fields of the radiation field patterns by way of screen-like passage areas. In this case, screen-like passage areas can preferably be achieved by damping the optical microscope on its side facing the light-sensitive layer.

The inventive near-field optical means can be advantageously used, in particular, when this reduces the size of the radiation fields in at least one direction to values clearly below the wavelength of the laser radiation.

In this case, the vector of the electric field E of the laser radiation is expediently such that this lies parallel to the direction, in which the extension of the radiation fields is smaller than the wavelength.

Since the areal extension of the radiation field patterns cannot be optionally increased in size without the optical beam guidance means needing to be of a complicated construction, it is advantageously provided, in order to shorten the required exposure times, for the lithography exposure device to generate several radiation field patterns.

Each radiation field pattern has light spots arranged in a defined, geometrical pattern, wherein the several radiation field patterns can be optionally arranged relative to one another.

In principle, it is conceivable for the several radiation field patterns to be movable in different exposure movement directions.

To avoid crossover movements it is advantageous when the several radiation field patterns are movable parallel to a single exposure movement direction.

The several radiation field patterns can preferably be used during the same exposure procedure so that larger sections of the light-sensitive layer can be exposed during one exposure procedure.

In principle, it would be possible to generate the several radiation field patterns so as to be offset with respect to time. It is, however, more favorable to generate the several radiation field patterns essentially at the same time.

It is of advantage, in particular, in the case of radiation field patterns generated essentially at the same time when a separate optical microscope is provided for each radiation field pattern.

It is even better when a separate optical beam guidance means is provided for each radiation field pattern.

The several radiation field patterns could, in principle, be supplied from one set of semiconductor lasers, in particular, when the same exposed sections are intended to be generated with each radiation field pattern.

The possibilities of using an inventive lithography exposure device are, however, greater when a single set of semiconductor lasers is available for each radiation field pattern so that different exposed sections can be generated with the radiation field patterns.

A solution which is particularly simple to design provides several exposure units which operate independently for generating the several radiation field patterns.

The inventive object is accomplished according to the invention, in addition, with a lithography process for the production of structures extending in a surface area in a light-sensitive layer due to exposure thereof by means of a large number of successive exposure steps for generating a plurality of conversion areas in the light-sensitive layer which together result in the structures, wherein each exposure step serves to transfer the material forming the light-sensitive layer from an unexposed initial state into the converted end state within the conversion area by means of a radiation field and wherein the radiation field is generated in the light-sensitive layer by the focusing of laser radiation and additional limitation of the laser radiation in a lateral direction by means of a screen aperture elongated at right angles to the lateral direction with an effective extension in the lateral direction which is in the order of magnitude of the wavelength of the laser radiation or less, in that for the production of some of the conversion areas radiation fields are used with a distribution of energy which makes it necessary for the action of at least two radiation fields on the same conversion area in the light-sensitive layer to be required in order to transfer the material of the light-sensitive layer in this area into the end state.

The advantage of the inventive process is, in the same way as with the inventive lithography exposure device, to be seen in the fact that it is possible to obtain conversion areas with an extension which is smaller in at least one direction than the extension of the radiation fields used for this purpose.

In this respect, it is particularly favorable when the at least two radiation fields act on the light-sensitive layer in an overlapping manner and for an overlapping area thereof to cover the conversion area.

In this respect, the two, partially overlapping radiation fields can extend with their lateral directions parallel to one another.

Such a partial overlapping can, however, be achieved particularly advantageously when a first radiation field of the radiation fields acting on the same conversion area has the effective extension in a lateral direction along a first direction and that a second radiation field of the radiation fields acting on the same conversion area has an effective extension in a lateral direction which extends along a second direction extending at an angle to the first direction.

In this respect, it is possible to arrange the partially overlapping radiation fields such that they overlap with end areas. It is, however, particularly favorable when the radiation fields are superimposed such that the superposition is brought about in the central area of at least one of the radiation fields.

If more than two radiation fields are superimposed, it is preferably provided for these radiation fields to all be arranged at a different angle with respect to a selected radiation field.

In the case of several radiation fields, the radiation fields are preferably arranged such that radiation fields following one another in a direction of rotation are arranged relative to one another at approximately the same angular distance.

With a view to the action of the radiation fields with respect to time, no further details have so far been given. It would be conceivable, for example, in one solution for the radiation fields to act on the conversion area one after the other with respect to time, wherein, in this case, a precondition is that the material of the light-sensitive layer is such that the effect of the first radiation field is maintained, even though this has not yet resulted in a conversion of the material into the converted end state, and the action of the two radiation fields is added together, even if this occurs in succession with respect to time, so that altogether the conversion of the material of the light-sensitive layer into the converted state is achieved following the action of at least the second radiation field or also the additional radiation fields.

Furthermore, it would be conceivable for the radiation fields to act on the conversion area in a manner overlapping with respect to time so that the material of the light-sensitive layer stores the effect of the first radiation field for such a time until the second radiation field has acted.

A further, advantageous solution of the inventive lithography process provides for the radiation fields to act on the conversion area essentially simultaneously; this solution is of advantage, in particular, with a view to the time required for the inventive lithography process and in the case where the intensity of both radiation fields is intended, where possible, to take effect simultaneously.

Additional features and advantages of the inventive solution are the subject matter of the following description as well as the drawings illustrating several embodiments.

In the drawings:

FIG. 7 shows an illustration of an example of a structure of the light-sensitive layer;

FIG. 8 shows an illustration of a second embodiment of the inventive lithography exposure device;

FIG. 9 shows an illustration of the superposition of two radiation fields in the second embodiment;

FIG. 10 shows a third embodiment of the inventive lithography exposure device;

FIG. 11 shows an illustration of the superposition of two radiation fields in the third embodiment;

FIG. 12 shows an illustration of a fourth embodiment and

Figure 1:
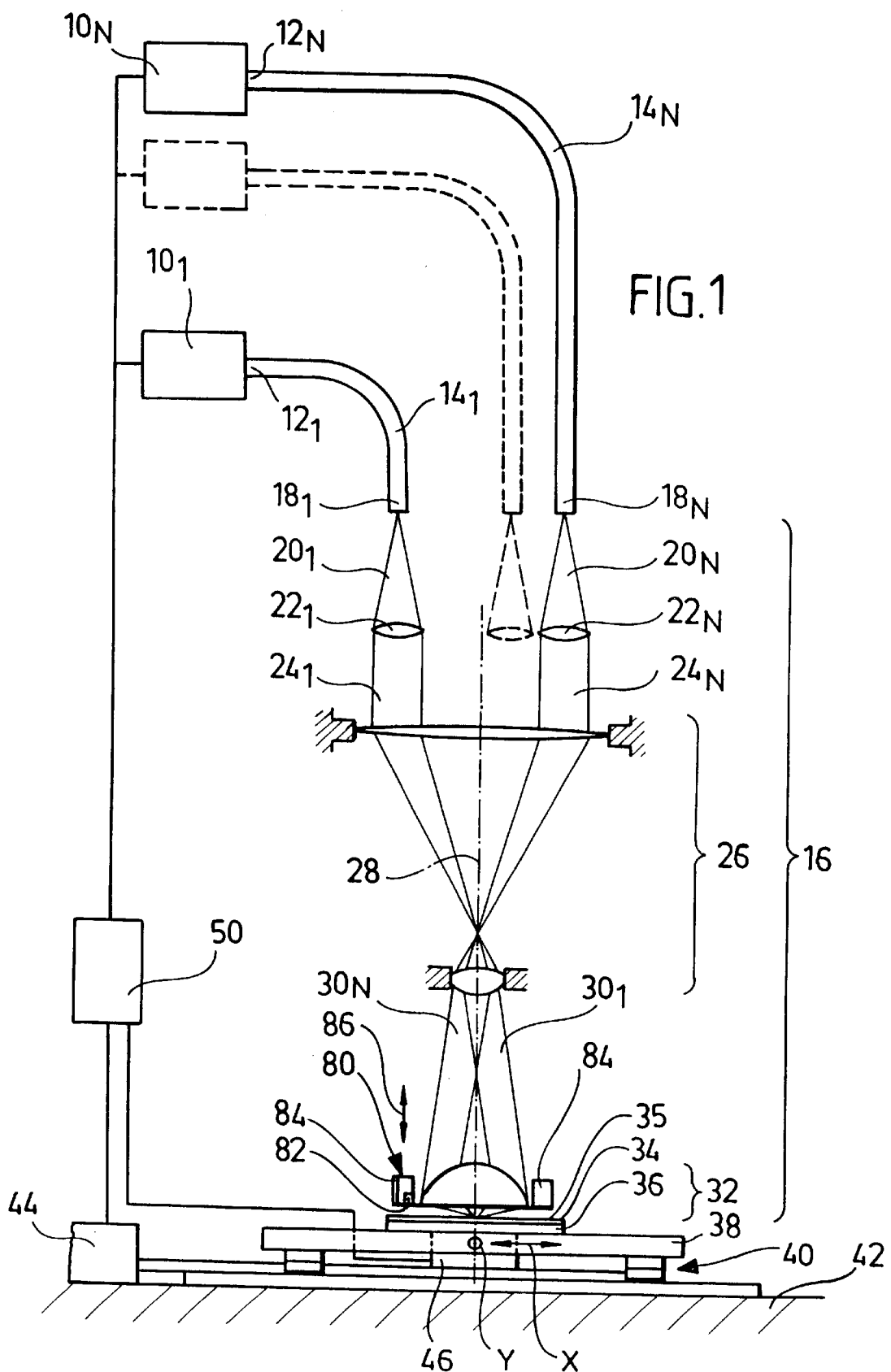
FIG. 1 shows a schematic view of a first embodiment of an inventive lithography exposure device.

A first embodiment of an inventive lithography exposure device, illustrated in FIG. 1, comprises a plurality of laser units $10_1$ to $10_N$ which comprise semiconductor lasers and preferably generate laser radiation in the blue spectral range which enters first ends $12_1$ to $12_N$ of light guides $14_1$ to $14_N$, preferably single mode fibers, is guided from these to an optical beam guidance means designated as a whole as 16 and exits from second ends $18_1$ to $18_N$ of the light guides $14_1$ to $14_N$ to enter the optical beam guidance means 16, wherein the second ends $18_1$ to $18_N$ and the optical beam guidance means preferably form an intrinsically inflexible optical unit. The laser radiation exits from the second ends $18_1$ to $18_N$ of the light guides $14_1$ to $14_N$ in the form of divergent beam bundles $20_1$ to $20_N$ and is shaped by respective collimating elements $22_1$ to $22_N$ to form respective collimated radiation bundles $24_1$ to $24_N$.

These collimated radiation bundles $24_1$ to $24_N$ are imaged by an optical telescope 26 comprised by the optical beam guidance means 16 such that their distance from a central axis or axis of symmetry 28 is reduced.

Divergent radiation bundles $30_1$ to $30_N$ again exit from the optical telescope 26 and are, for their part, imaged by an optical microscope 32 onto a light-sensitive layer 34 applied to a substrate 36, wherein it is necessary in order to obtain a precise imaging for the optical beam guidance means 16 to form an intrinsically invariable optical unit with its second ends $18_1$ to $18_N$, the collimating elements $22_1$ to $22_N$, the optical telescope 26 as well as the optical microscope 32.

The substrate 36 is, for its part, fixed on a displaceable table 38 forming a mounting device, wherein the displaceable table 38 is fixed on a base 42 by means of a cross slide device 40 so as to be displaceable in two directions X and Y extending at right angles to one another. Two adjusting drives with distance measuring systems 44 and 46 which can be controlled via a control 50 are provided for the exact displacement of the displaceable table 38 relative to the base 42.

Furthermore, all the laser units $10_1$ to $10_N$ can likewise be controlled with the control 50.

To generate the relative movement between the substrate 36 and the optical beam guidance means 16 the entire optical beam guidance means 16 is preferably arranged so as to be stationary relative to the base 42 so that only the substrate 36 with the light-sensitive layer 34 arranged thereon is movable relative to the optical beam guidance means 16.

Figure 2:
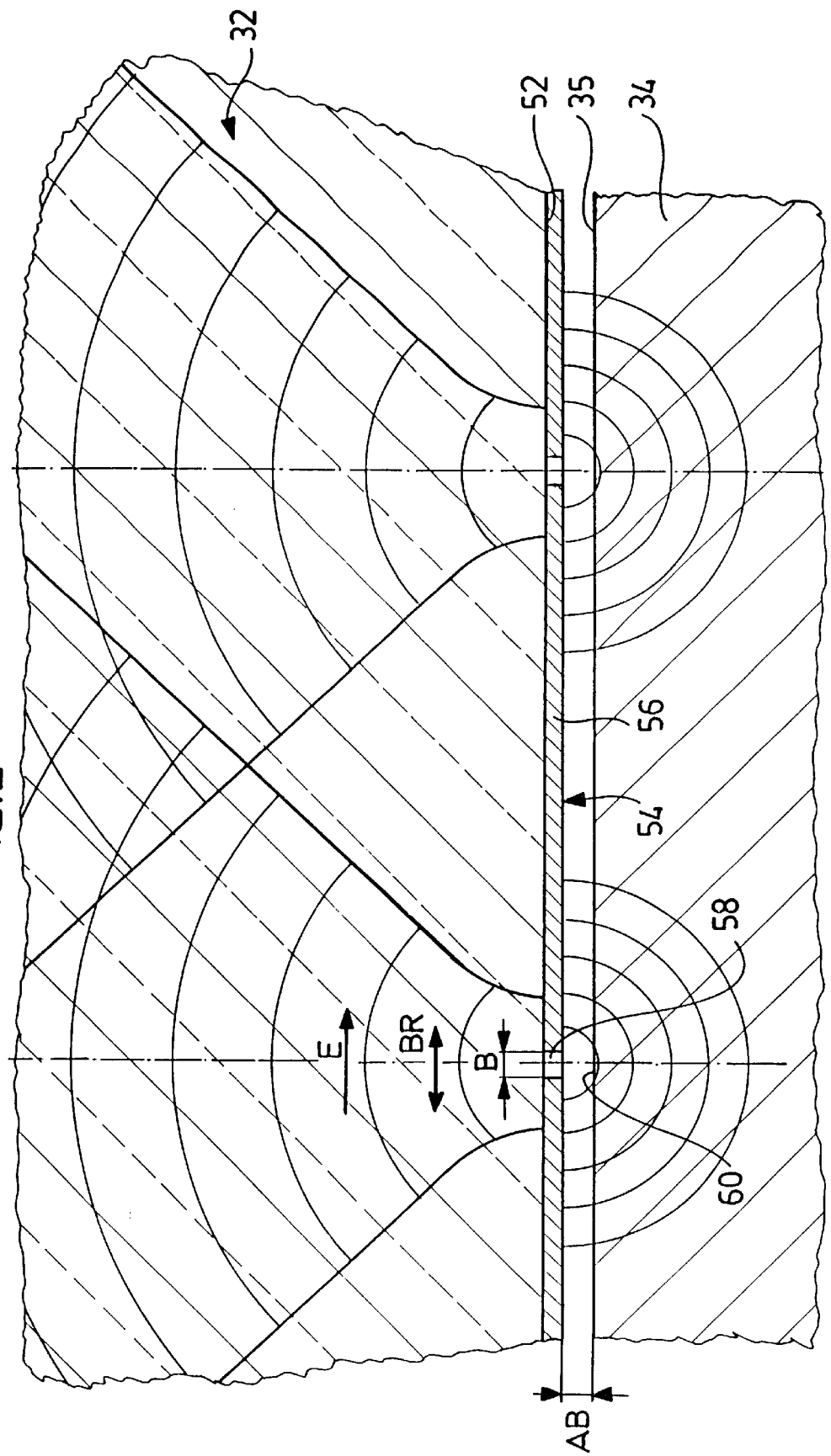
FIG. 2 shows an enlarged sectional illustration of the first embodiment in the area of a near-field optical means with a sectional plane lying parallel to the width of a screen aperture.
Figure 3:
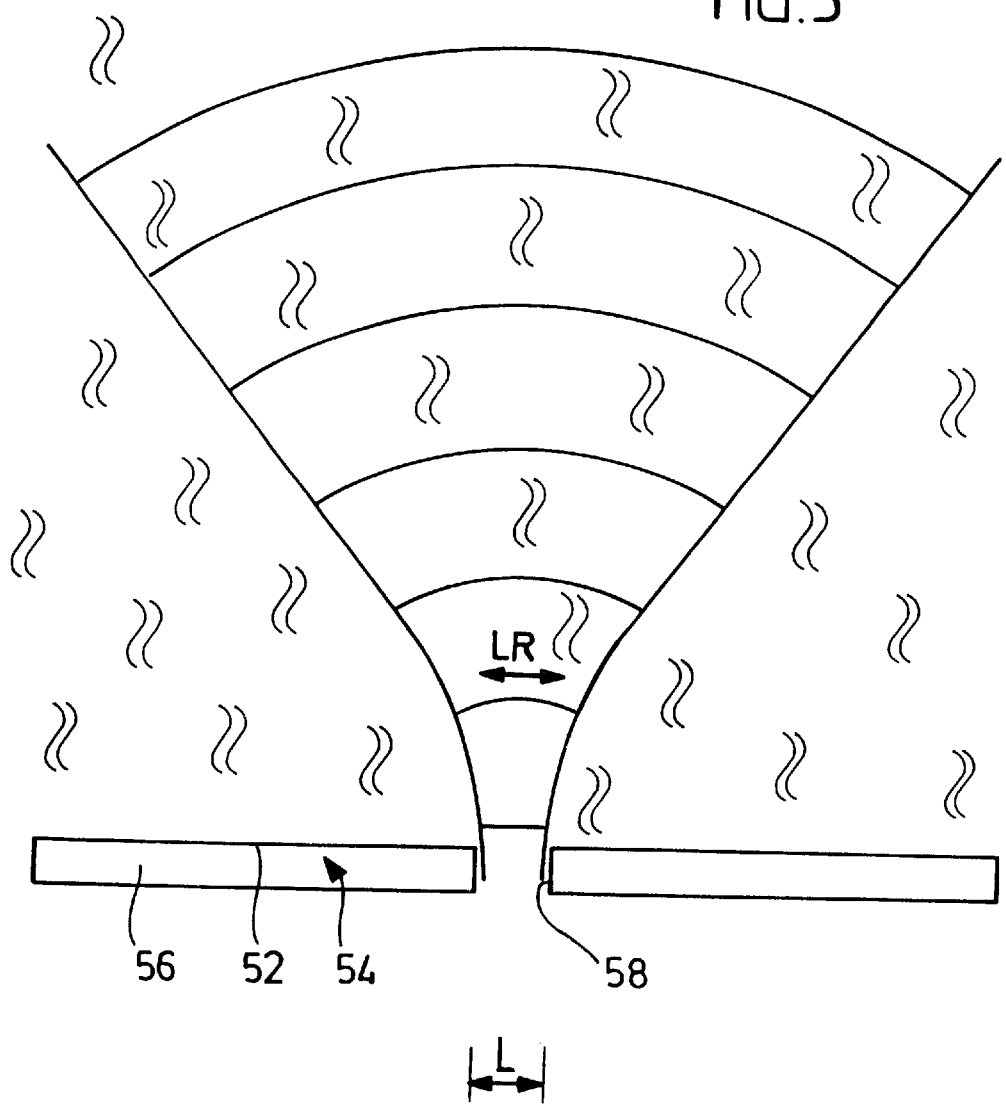
FIG. 3 shows a section similar to FIG. 3 in a sectional plane lying parallel to a longitudinal direction of the screen aperture.

With the inventive solution, illustrated in FIGS. 2 and 3, the optical microscope 32 is provided on its side 52 facing the light-sensitive layer 34 with a near-field optical means 54 which is arranged in the area, in which the laser radiation imaged by the optical microscope 32 on a reduced scale exits from this. The near-field optical means 54 can thereby be designed in the most varied of ways.

As illustrated in FIGS. 2 and 3, the near-field optical means 54 is preferably formed by a coating acting as a screen 56 which is designed to be reflecting or absorbing and has a screen aperture 58, through which the laser radiation then exits. The spatial extension of radiation fields 60 exiting from the screen aperture 58 can be determined with this aperture independently of the beam shaping by the rest of the optical microscope 32. In this respect, the screen-like apertures 58 are dimensioned such that the radiation fields 60 have in at least one lateral direction BR an extension effective in the light-sensitive layer 34 which is in the order of magnitude of the wavelength of the laser light used or smaller. Extensions of the radiation fields 60 in the lateral direction BR, for example, in the order of magnitude of up to several 100 nanometers but also smaller than 200 or even better smaller than 100 nanometers can be achieved, wherein, in this case, the incoming light wave must have a vector of the electric field E which extends parallel to the width B which has such a dimension.

In their longitudinal direction LR, at right angles to the width B, the screen apertures 58 preferably have an extension L which is at least in the order of magnitude of the wavelength of the laser radiation and corresponds at least to the extension of the B field of the light wave but is preferably a multiple of the width B.

Figure 4:
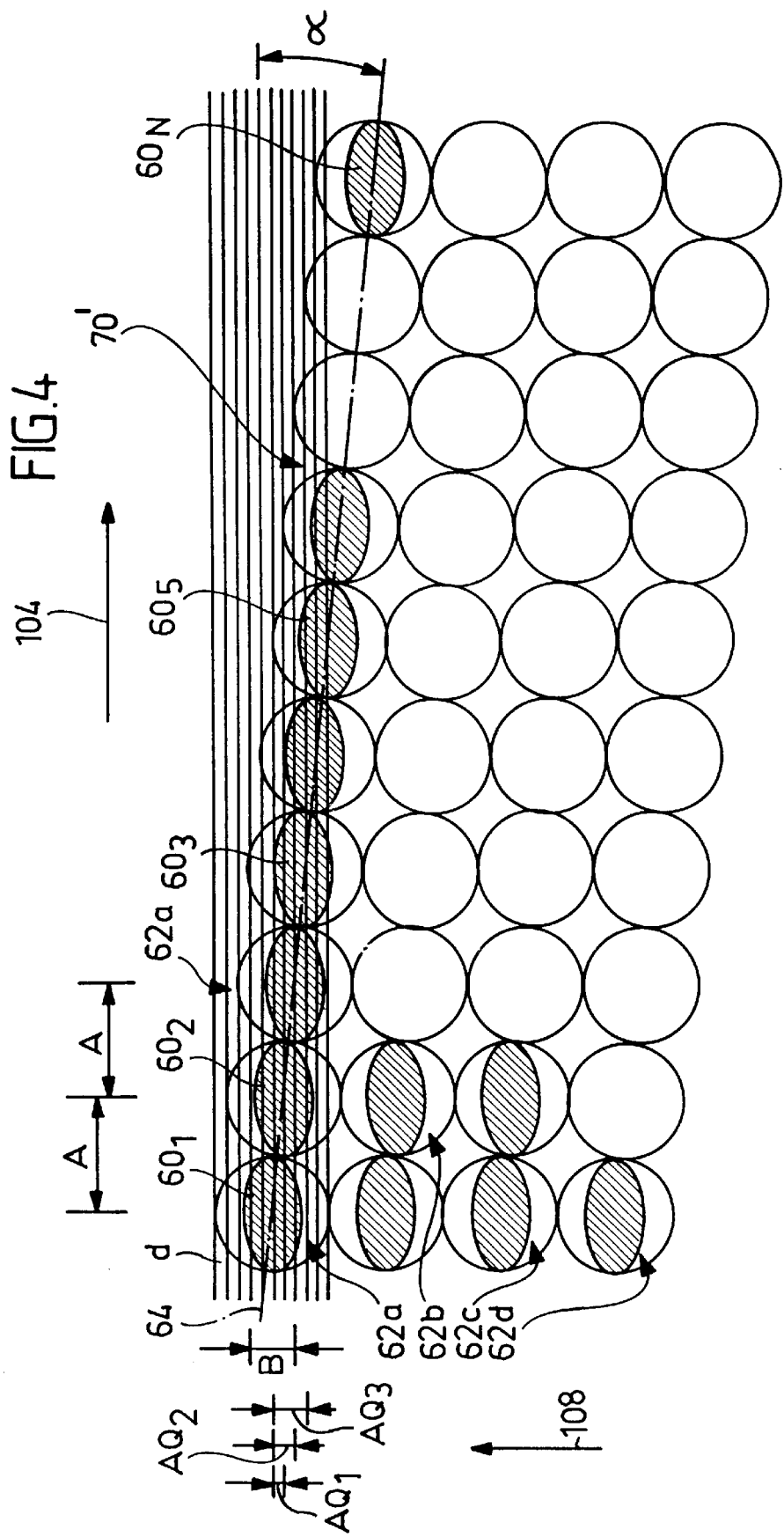
FIG. 4 shows a first embodiment of a radiation field pattern of the lithography exposure device according to FIG. 1.

As illustrated in FIG. 4, the laser radiation is imaged by the optical microscope 32, for example, onto a surface 35 of the light-sensitive layer 34 such that a plurality of first radiation fields $60_1$ to $60_N$ results, which each have the same width B and the same length L as well as an approximately parallel alignment of the lateral directions BR relative to one another and are arranged at a constant distance A from one another as a series 62 along a series direction 64 and, as a result, form a first radiation field pattern 70 on the surface 35.

As a result of the movement of the substrate 36 in the X and/or Y directions, the entire first radiation field pattern 70 can be moved across the light-sensitive layer 34 which covers the substrate 36, namely such that each point of the entire surface 54 can be exposed by at least one radiation field 60.

The substrate 36 is preferably a wafer of conventional size, on which a plurality of lithographic structures, for example, for semiconductor components is intended to be generated.

The radiation field 60 exiting from the screen aperture 58 can no longer be described with the laws of geometric optics on account of the size of the screen aperture 58 but rather as a spherical wave, as illustrated in FIG. 2, wherein, in this case, the spherical wave determines the dimension of the radiation field 60 on the surface 35 of the light-sensitive layer 34.

For this reason it is necessary to provide the optical microscope 32 with a height adjustment device 80 which guides the near-field optical means 54 at a defined distance AB above the surface 35 of the light-sensitive layer 34 during the exposure movements in the exposure movement direction 104. The height adjustment device 80 preferably keeps the near-field optical means 54 and thus the entire optical microscope 32 at a distance AB above the surface 35 of the light-sensitive layer 34 which is approximately in the order of magnitude of the wavelength of the laser light. This ensures that the spatial extension of the radiation field 60 is not altered by the fact that the distance AB between the surface 35 and the near-field optical means 54 is changed substantially during the exposure movement in exposure movement direction 104 (FIG. 1).

Such a height adjustment device 80 preferably operates with a sensor 82 which constantly detects the distance AB from the surface 35 and a control element 84 which preferably adjusts the entire optical microscope 32 in a vertical direction 86 at right angles to the surface 35 (FIG. 1).

Variations in the thickness of the substrate 36 as well as the thickness of the light-sensitive layer 34 can thus be compensated with such a height adjustment device 80.

With the first embodiment of a first radiation field pattern 70 illustrated in FIG. 4, the screen apertures 58 determining the first radiation fields 60 are arranged such that their lateral directions BR all extend parallel to one another and, consequently, all the longitudinal directions LR are also aligned parallel to one another.

Furthermore, the longitudinal directions LR preferably extend parallel to an exposure movement direction 104 so that the first radiation fields 60 are also aligned parallel to this.

In order to obtain as fine a writing raster (grid) as possible in a transverse direction 108 extending at right angles to the exposure movement direction 104, the series direction 64 of the series 62 is arranged in the first embodiment of the inventive solution, as illustrated in FIG. 4, at such an acute angle α relative to the exposure movement direction 104 that consecutive radiation fields $60_1$, $60_2$ or $60_2$, $60_3$ etc. are displaced in the transverse direction 108 by a fraction of the width B of the radiation fields 60 corresponding to the increment d and so, as illustrated in the embodiment according to FIG. 4, a writing raster with an increment d can, for example, be achieved which represents a quarter of the effective width B of the radiation fields 60. This means that the radiation field $60_5$ of the series 62 is displaced in the transverse direction 108 in relation to the radiation field $60_1$ by the width 4×d=B.

Coarser or finer writing rasters are, however, also conceivable, wherein the writing raster determined by the increment d should be at least one third of B in order to obtain an adequate fineness of the writing raster in the transverse direction 108 at right angles to the exposure movement direction 104.

In this case, the radiation field pattern 70 is preferably formed by a plurality of series $62_a$ to $62_d$ of radiation fields 60 extending parallel to one another, wherein a predetermined increment d exists in the transverse direction 108 within each series from radiation field to radiation field.

Figure 5:
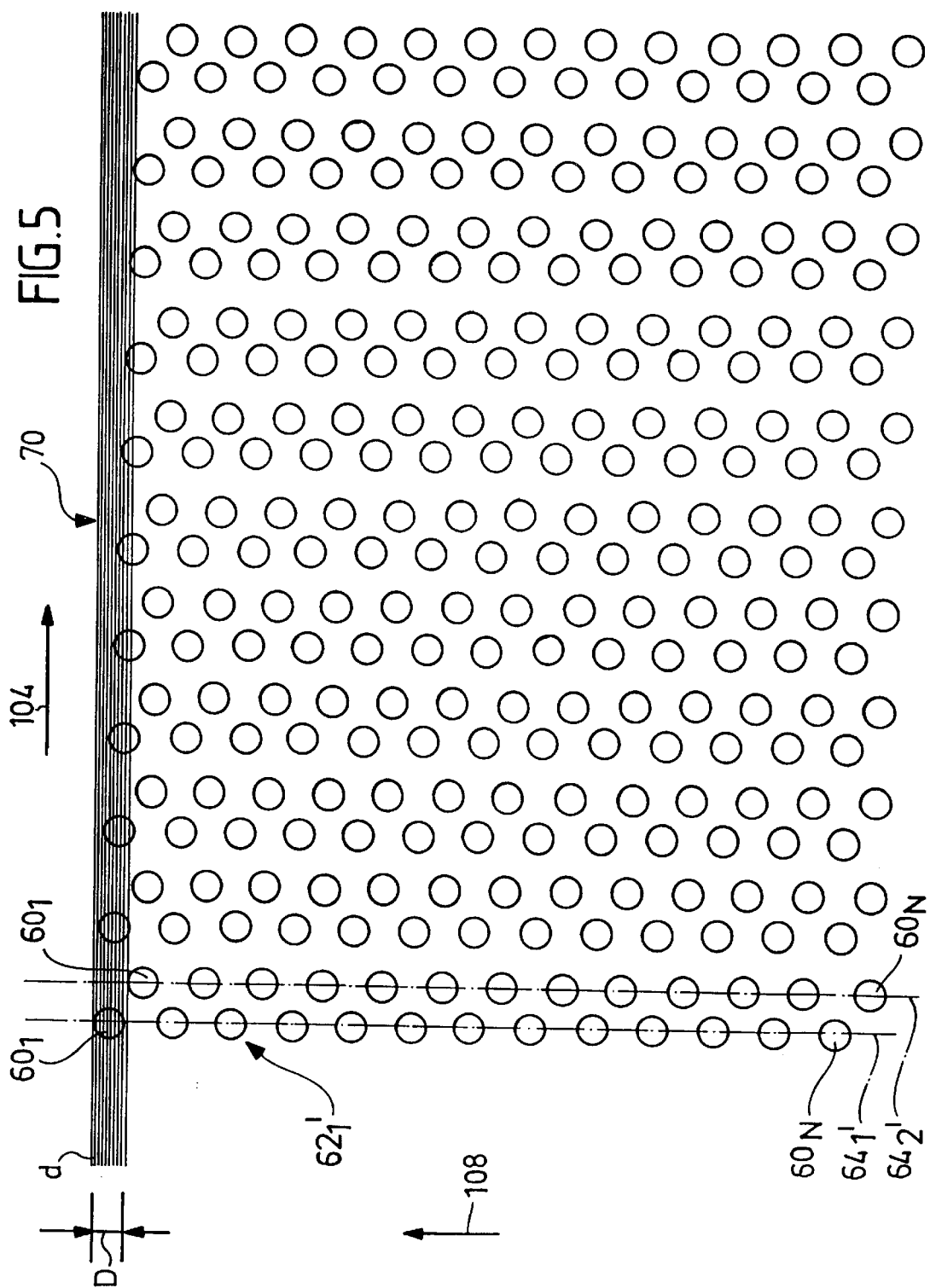
FIG. 5 shows a second embodiment of a radiation field pattern of the inventive lithography exposure device according to FIG. 1.

In a second embodiment of an inventive first radiation field pattern 70', illustrated in FIG. 5, the series directions 64' of the individual series 62' extend at right angles to exposure movement direction 104 but the radiation fields 60 of the individual series 62' are offset relative to one another such that in the entire first radiation field pattern 70' an additional radiation field exists for each radiation field 60 and this is offset by an increment d in the transverse direction 108 at right angles to the exposure movement direction 104.

It is thus possible, altogether, with such a radiation field pattern 70' to operate in the transverse direction 108 with a resolution d. In this respect, a precise exposure of the substrate 36 is possible within the pattern extension at right angles to the exposure movement direction 104 which is predetermined by the radiation field pattern 70' since the relative arrangement of the first radiation fields 60 in relation to one another and the size of them remain unchanged.

Afterwards, insofar as the radiation field pattern 70' does not already extend over the entire substrate 36 in the transverse direction 108, the radiation field pattern 70' is to be offset as a whole in the transverse direction 108 by a distance which corresponds to the pattern extension of the radiation field pattern 70' in the transverse direction 108, wherein during each traveling over the light-sensitive layer 34 an exposure is possible over the entire pattern extension of the radiation field pattern 70' in the transverse direction 108 and so fewer exposure movements of the radiation field pattern 70' in the exposure movement direction 104 are required to expose the entire light-sensitive layer 34 on the substrate 36, the number of exposure movements resulting from the extension of the light-sensitive layer 34 in the transverse direction 108 divided by the pattern extension of the radiation field pattern 70' in this direction.

Figure 6:
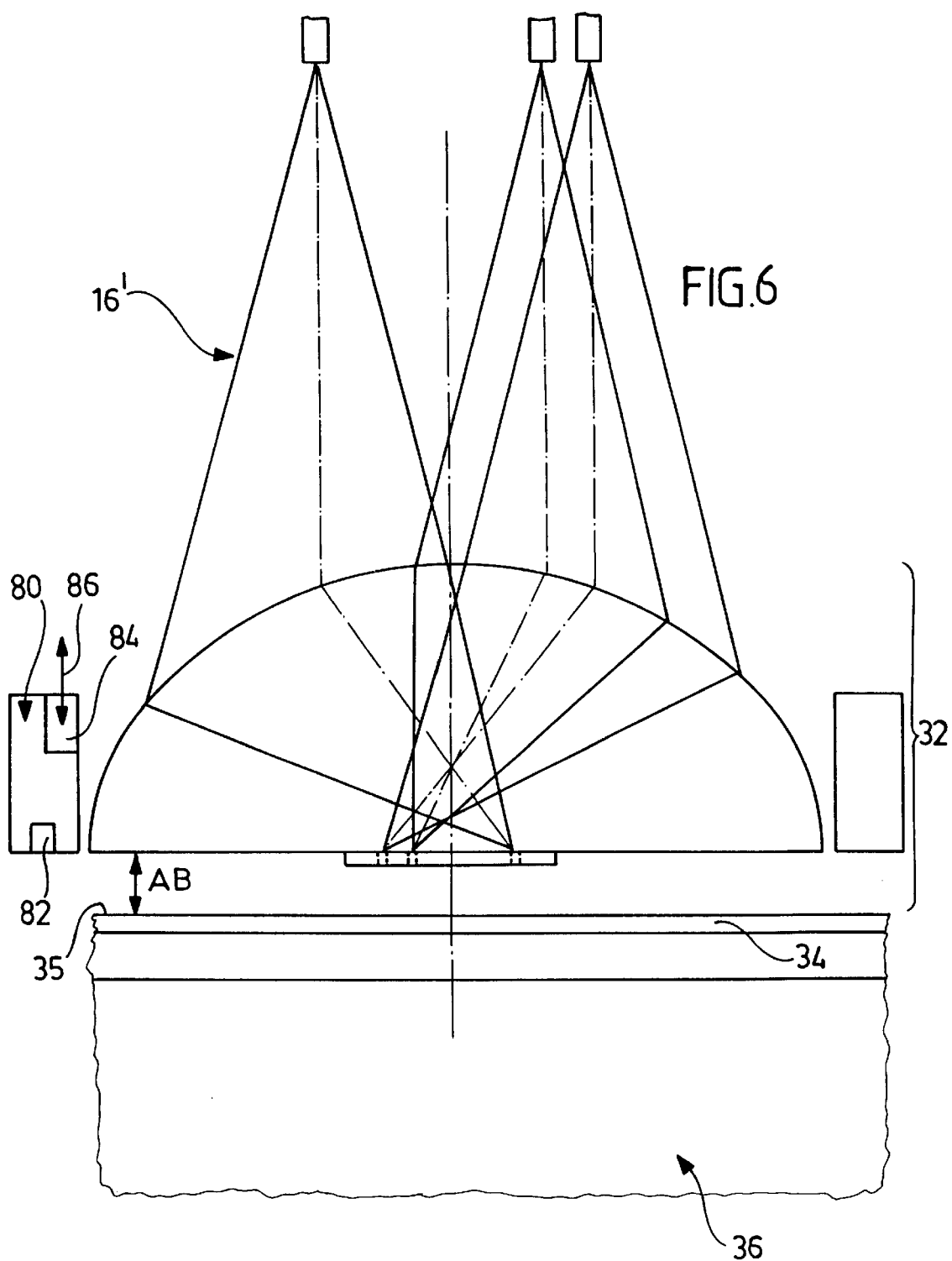
FIG. 6 shows an illustration of a section of a variation of the first embodiment of the inventive lithography exposure device.

In a variation of the first embodiment of an inventive lithography exposure device, illustrated in FIG. 6, it is provided for the light guides $14_1$ to $14_N$ proceeding from the laser units $10_1$ to $10_N$ to lead to an optical beam guidance means 16' which merely comprises the optical microscope 32. In this case, the individual light guides $14_1$ to $14_N$ are arranged so closely next to one another that the divergent laser radiation $20_1$ to $20_N$ emanating from them can immediately enter the optical microscope 32 and does not require any further prior reduction in size.

Alternatively to providing fiber ends $18_1$ to $18_N$ located next to one another it is conceivable in a further variation to arrange an array of semiconductor lasers, for example, in the form of vertical emitters directly at the input side of the optical microscope 32.

With a first radiation field pattern according to the preceding embodiments a structure 100 for a semiconductor component extending in a surface area can, as illustrated in FIG. 7, be produced in the light-sensitive layer 34 with a shape which has in a section 102 transverse to the exposure movement direction 104 a transverse extension QAD which is smaller than the effective width B of a radiation field 60, wherein two radiation fields 60 offset in the transverse direction 108 by an increment n×d are used in an overlapping manner and both have such a distribution of intensity that a one-time exposure of the material of the light-sensitive layer 34 is not sufficient to transfer this from an unexposed initial state into the converted end state. On the contrary, the intensity is selected such that at least two radiation fields 60 acting in an overlapping manner are necessary to lead in the overlapping area, in which the intensity of the two radiation fields 60 is added together, to a conversion of the material of the light-sensitive layer 34 into the converted end state. As a result, the conversion area U, in which the material of the light-sensitive layer 34 is transferred into the converted state, results only in the overlapping area of the two radiation fields 60.

As a result of the fact that the two radiation fields 60 now overlap but may be arranged so as to be offset it is possible to obtain a conversion area U which has in the transverse direction 108 an extension QAD which is smaller than the extension, i.e. in the present case the width B, of the radiation fields 60 in this direction.

In a second embodiment of an inventive solution, illustrated schematically in FIG. 8, the first radiation field pattern 70 is arranged in the same way as in the first embodiment. However, a second radiation field pattern 170 with second radiation fields 160 is provided in addition and these fields are arranged in the same way as with the first radiation field pattern 70 but their lateral direction BR extends within the second radiation field pattern 170 parallel to the exposure movement direction 104.

In this respect, the first radiation field pattern 70 and the second radiation field pattern 170 are preferably arranged so as to be interleaved in one another, namely such that in a row 62 a first radiation field 60 is followed each time by a second radiation field 160, the centers 61 and 161 of which are located on a straight line parallel to the exposure movement direction 104. The next first radiation field $60_2$ then follows and this is displaced in the transverse direction 108 in relation to the preceding first radiation field $60_1$ by the increment d and is followed by the next second radiation field $160_2$ which is displaced in the transverse direction 108 in the same way by the increment d.

With first radiation fields 60 and second radiation fields 160 provided in this way it is possible, when the distribution of intensity in both radiation fields 60, 160 is such that a single action of one of the radiation fields 60, 160 does not lead to the complete conversion of the material of the light-sensitive layer 34, to obtain a conversion area U by way of overlapping positioning of one of the first radiation fields 60 and one of the second radiation fields 160 which has in X direction and Y direction an extension which corresponds approximately to the width B of the radiation fields 60, 160. As a result, an essentially quadratic conversion field U can be achieved which has in all directions an extension in the order of magnitude of the wavelength of the laser light or smaller.

In the second embodiment illustrated in FIG. 8, a separate, respective screen aperture 58 with a corresponding alignment thereof is required for generating each first radiation field 60 and each second radiation field 160, wherein a separate radiation source which can be controlled in the desired periods of time with respect to its power is preferably associated with each of the screen apertures 58 in order to position the first radiation field 60 and the second radiation field 160 such that their action areas overlap in the light-sensitive layer 34 and thus the conversion area U is formed due to the overlapping (FIG. 9).

Since, in accordance with the second embodiment, a movement of the optical microscope 32 with the near-field optical means 54 and two exposure steps are already required for producing a conversion area U, such a procedure is time-consuming in the same way as in the first embodiment.

For this reason, an embodiment illustrated in FIG. 10 provides for each screen 56 to have two screen apertures $58_1$ and $58_2$ crossing over one another and to thus be in a position to spatially determine not only a first radiation field 60 but also a second radiation field 160 with respect to its effective extension.

As a result, it is not necessary in such an embodiment to move the optical microscope 32 with the near-field optical means in the exposure movement direction 104 in order to generate a single conversion area U.

However, it is necessary in this embodiment to guide laser radiation with two directions of polarization to the optical microscope 32 by means of the light guides 14. For this reason, two laser units $10_{N1}$ and $10_{N2}$ are preferably associated with each of the light guides 14, wherein the laser unit $10_N$, for example, supplies laser radiation, the E vector of which extends parallel to the lateral direction BR of the first screen aperture $58_1$ and forms a first radiation field 60, while the second laser unit 10 supplies laser radiation with a polarization, the E vector of which extends parallel to the lateral direction BR of the second screen aperture $58_2$ and forms a second radiation field 160.

In this respect, the laser units $10_{N1}$ and $10_{N2}$ may be operated by the control 50 either simultaneously or overlapping with respect to time or also one after the other with respect to time in order to generate, where applicable, the first radiation field 60 and the second radiation field 160 (FIG. 11).

The laser radiation of the two laser units $10_{N1}$ and $10_{N2}$ is preferably coupled into the corresponding light guide 14 by means of a polarization fiber coupler 110.

Figure 13:
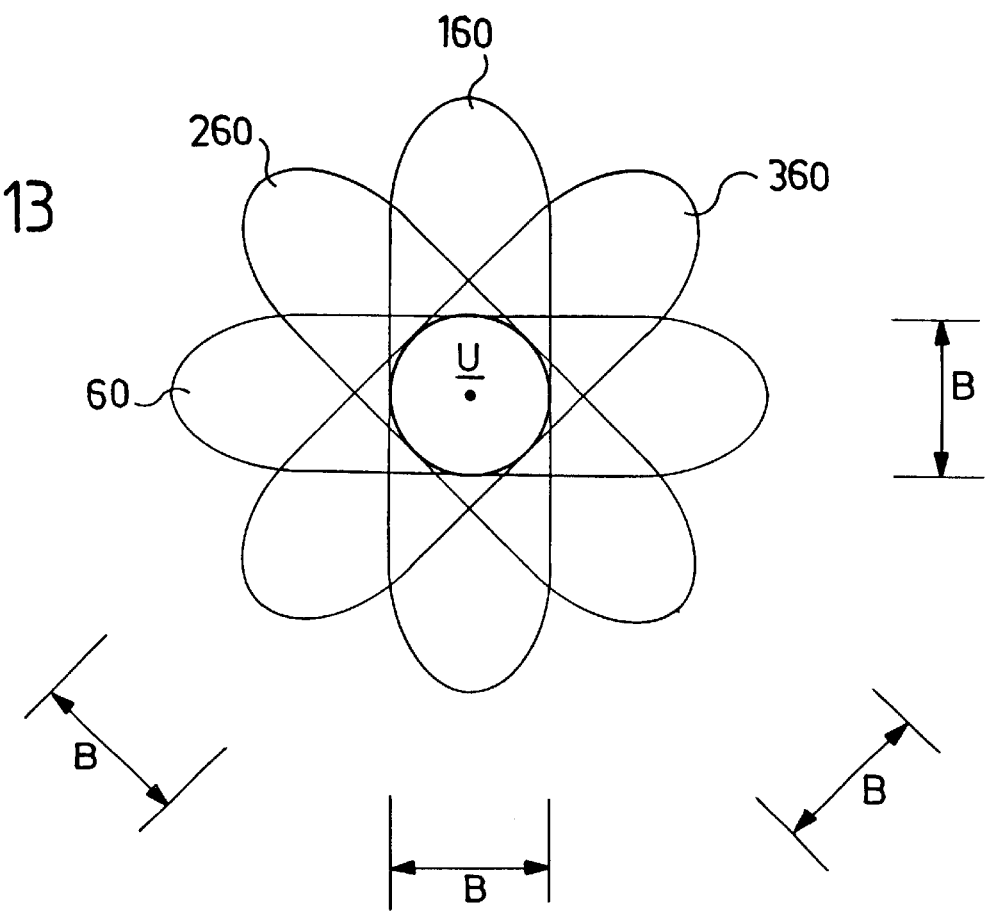
FIG. 13 shows an illustration of the superposition of the radiation fields in the fourth embodiment.

In a fourth embodiment of an inventive lithography exposure device, as illustrated in FIG. 12, it is not only provided for the first radiation field 60 to be superimposed with the second radiation field 160 but rather a third radiation field 260 and a fourth radiation field 360 are provided, in addition, which likewise extend transversely to one another and, in addition, transversely to the first radiation field 60 and to the second radiation field 160, preferably at an angle in the order of magnitude of 45° to them, so that, as illustrated in FIG. 13, the conversion area U is generated by the superposition of four radiation fields, namely the first radiation field 60, the second radiation field 160, the third radiation field 260 and the fourth radiation field 360 and a complete conversion of the material of the light-sensitive layer 34 from the initial state into the completely converted state is brought about only in the area, in which all four radiation fields 60, 160, 260, 360 overlap. As a result, the conversion area U can be produced with an outer contour which is determined in the respective direction by the width B of the corresponding radiation field of the four radiation fields when it is assumed that only the effect of the superposition of the intensities of four radiation fields leads to a conversion area U.

If it is assumed that all the radiation fields 60, 160, 260, 360 have the same width B, the diameter of the conversion area U is defined by the width B thereof.

What is claimed is:

1. A lithography process for the production of structures extending in a surface area of a light-sensitive layer, comprising:

exposing said light-sensitive layer by means of a plurality of successive exposure steps to generate a plurality of conversion areas in the light-sensitive layer, said conversion areas together resulting in said structures, each exposure step serving to transfer the material forming the light-sensitive layer from an unexposed initial state into a converted end state within the conversion area by means of at least one radiation field, each radiation field being generated in the light-sensitive layer by the focusing of laser radiation and additional spatial limitation of the laser radiation by means of a screen aperture, said screen aperture being arranged at a surface of a near field optical means from which said radiation field exits and at a distance from a surface of said light sensitive layer in the order of a magnitude of a wavelength of said laser light, said screen aperture being elongated in shape and having an extension in a longitudinal direction which is greater than an extension in a lateral direction transverse to said longitudinal direction, the screen aperture being elongated at right angles to the lateral extension in the lateral direction on an order of magnitude of the wavelength of the laser radiation or less, and use of at least two partially overlapping radiation fields for the production of some of the conversion areas in the course of a relative movement between said light-sensitive layer and said radiation fields in an exposure movement direction, said at least two partially overlapping radiation fields having a distribution of energy that requires the action of said at least two radiation fields on the same conversion area in the light-sensitive layer, to transfer the material of the light-sensitive layer in this area into said converted end state, said conversion area being within the area of overlap of said partially overlapping radiation fields.

2. A lithography process as defined in claim 1, wherein the at least two radiation fields act on the light-sensitive layer in an overlapping manner and that an overlapping area thereof covers the conversion area.

3. A lithography process as defined in claim 2, wherein the overlapping radiation fields extend with their lateral direction parallel to one another.

4. A lithography process as defined in claim 1, wherein:

a first radiation field of the radiation fields acting on the same conversion area has said effective extension in a lateral direction along a first direction, and a second radiation field of the radiation fields acting on the same conversion area has an effective extension in a lateral direction extending along a second direction at an angle to the first direction.

5. A lithography process as defined in claim 1, wherein the radiation fields acting on the same conversion area are superimposed such that the superposition is brought about in a central area of at least one of the radiation fields.

6. A lithography process as defined in claim 1, wherein the radiation fields acting on the same conversion area are all arranged at a different angle with respect to a selected radiation field.

7. A lithography process as defined in claim 1, wherein the radiation fields acting on the same conversion area act on this conversion area one after the other with respect to time.

8. A lithography process as defined in claim 1, wherein the radiation fields acting on the same conversion area act on the conversion area in a manner overlapping in time.

9. A lithography process as defined in claim 1, wherein the radiation fields acting on the same conversion area act on this conversion area essentially simultaneously.

* * * * *